United States Patent
Tang et al.

(10) Patent No.: US 11,611,317 B2
(45) Date of Patent: Mar. 21, 2023

(54) CIRCUITRY APPLIED TO MULTIPLE POWER DOMAINS

(71) Applicant: Realtek Semiconductor Corp., HsinChu (TW)

(72) Inventors: Wei-Cheng Tang, Hsinchu (TW); Li-Lung Kao, Hsinchu (TW); Chia-Ling Chang, HsinChu (TW); Sheng-Tsung Wang, HsinChu (TW); Sheng-Wei Lin, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 11 days.

(21) Appl. No.: 17/334,821

(22) Filed: May 31, 2021

(65) Prior Publication Data

US 2021/0399693 A1    Dec. 23, 2021

(30) Foreign Application Priority Data

Jun. 22, 2020   (TW) .................................. 109121195

(51) Int. Cl.
*H03F 3/04*     (2006.01)
*H03F 3/20*     (2006.01)

(52) U.S. Cl.
CPC ......... *H03F 3/04* (2013.01); *H03F 2200/129* (2013.01)

(58) Field of Classification Search
CPC .... H03F 3/04; H03F 2200/129; H03F 1/0211; H03F 2203/45522; H03F 2203/45528; H03F 2203/45534; H03F 3/45475; H03G 1/0088

USPC .................................................. 330/297, 310
See application file for complete search history.

(56) References Cited

U.S. PATENT DOCUMENTS 6,476,678 B1 * 11/2002 Kolluri ..................... H03F 1/30
                                                                  330/297
8,587,374 B2 * 11/2013 Teng ........................ H03G 3/34
                                                                  330/84

FOREIGN PATENT DOCUMENTS

TW              465045           11/2001

* cited by examiner

*Primary Examiner* — Hieu P Nguyen
(74) *Attorney, Agent, or Firm* — Winston Hsu (57) ABSTRACT

The present invention provides a circuitry applied to multiple power domains, wherein the circuitry includes a first circuit block and second circuit block, the first circuit block is powered by a first supply voltage of a first power domain, and the second circuit block is powered by a second supply voltage of a second power domain. The first circuit block includes a first amplifier and a switching circuit. The first amplifier is configured to receive an input signal to generate a processed input signal. When the second circuit block is powered by the second supply voltage, the switching circuit is configured to forward the processed input signal to the second circuit block; and when the second circuit block is not powered by the second supply voltage, the switching circuit disconnects a path between the first amplifier and the second circuit block.

9 Claims, 6 Drawing Sheets

CIRCUITRY APPLIED TO MULTIPLE POWER DOMAINS

BACKGROUND OF THE INVENTION

1. Field of the Invention

The present invention relates to a circuitry applied to multiple power domains.

2. Description of the Prior Art

In an analog circuitry corresponding to multiple power domains, when a circuit block corresponding to one of the power domains does not need to be operated or the circuit block enters a sleep state, the power domain will stop generating a supply voltage to the circuit block to save power consumption. At this time, however, circuit blocks that correspond to other power domains and are still in operation may have leakage current flowing into the circuit block that enters the sleep state, causing additional power consumption.

SUMMARY OF THE INVENTION

It is therefore an objective of the present invention to provide a circuitry applied to the multiple power domains, which can effectively avoid the leakage currents between different circuit blocks, to solve the problems mentioned in the prior art.

According to one embodiment of the present invention, a circuitry applied to multiple power domains is disclosed, wherein the circuitry comprises a first circuit block and second circuit block, the first circuit block is powered by a first supply voltage of a first power domain, and the second circuit block is powered by a second supply voltage of a second power domain. The first circuit block comprises a first amplifier and a switching circuit. The first amplifier is configured to receive an input signal to generate a processed input signal. When the second circuit block is powered by the second supply voltage, the switching circuit is configured to forward the processed input signal to the second circuit block; and when the second circuit block is not powered by the second supply voltage, the switching circuit disconnects a path between the first amplifier and the second circuit block.

According to another embodiment of the present invention, a circuitry comprising a first amplifier, a first switch, a second switch, a first feedback circuit and a second feedback circuit is disclosed. The first amplifier is configured to receive an input signal to generate a processed input signal. The first switch is configured to selectively connect an output terminal of the first amplifier to a first terminal. The second switch is configured to selectively connect the output terminal of the first amplifier to a second terminal. The first feedback circuit is configured to receive the processed input signal from the first switch to generate a first feedback signal to an input terminal of the first amplifier. The second feedback circuit is configured to receive the processed input signal from the second switch to generate a second feedback signal to the input terminal of the first amplifier. The first switch and the second switch are not enabled simultaneously.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
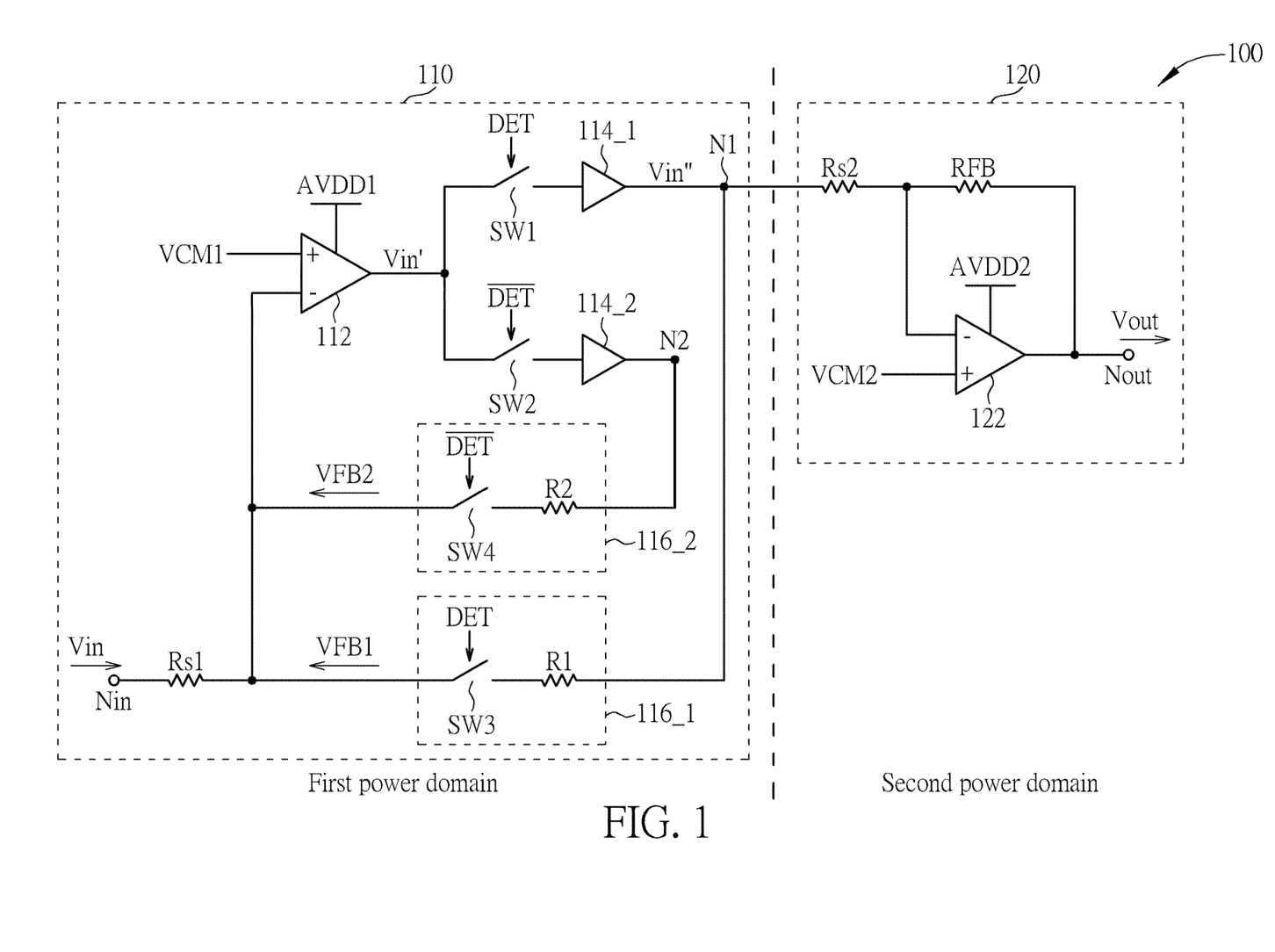
FIG. 1 is a diagram illustrating a circuitry applied to multiple power domains according to an embodiment of the present invention.

FIG. 1 is a diagram illustrating a circuitry 100 applied to multiple power domains according to an embodiment of the present invention. As shown in FIG. 1, the circuitry 100 includes a first circuit block 110 and a second circuit block 120, wherein the first circuit block 110 receives a first supply voltage AVDD1 from a first power domain, and the second circuit block 120 receives a second supply voltage AVDD2 from a second power domain. In this embodiment, the first circuit block 110 includes a first amplifier 112, a switching circuit, a first buffer 114_1, a second buffer 114_2, a first feedback circuit 116_1, a second feedback circuit 116_2 and an input resistor Rs1. The switching circuit includes a first switch SW1 and a second switch SW2, wherein the first switch SW1 is used to selectively connect the output terminal of the first amplifier 112 to the second circuit block 120 and the first feedback circuit 116_1, and the second switch SW2 is used to selectively connect the output terminal of the first amplifier 112 to the second feedback circuit 116_2. The first feedback circuit 116_1 includes a resistor R1 and a third switch SW3, and the second feedback circuit 116_2 includes a resistor R2 and a fourth switch SW4. In addition, the second circuit block 120 includes a second amplifier 122, an input resistor Rs2 and a feedback resistor RFB.

Figure 2:
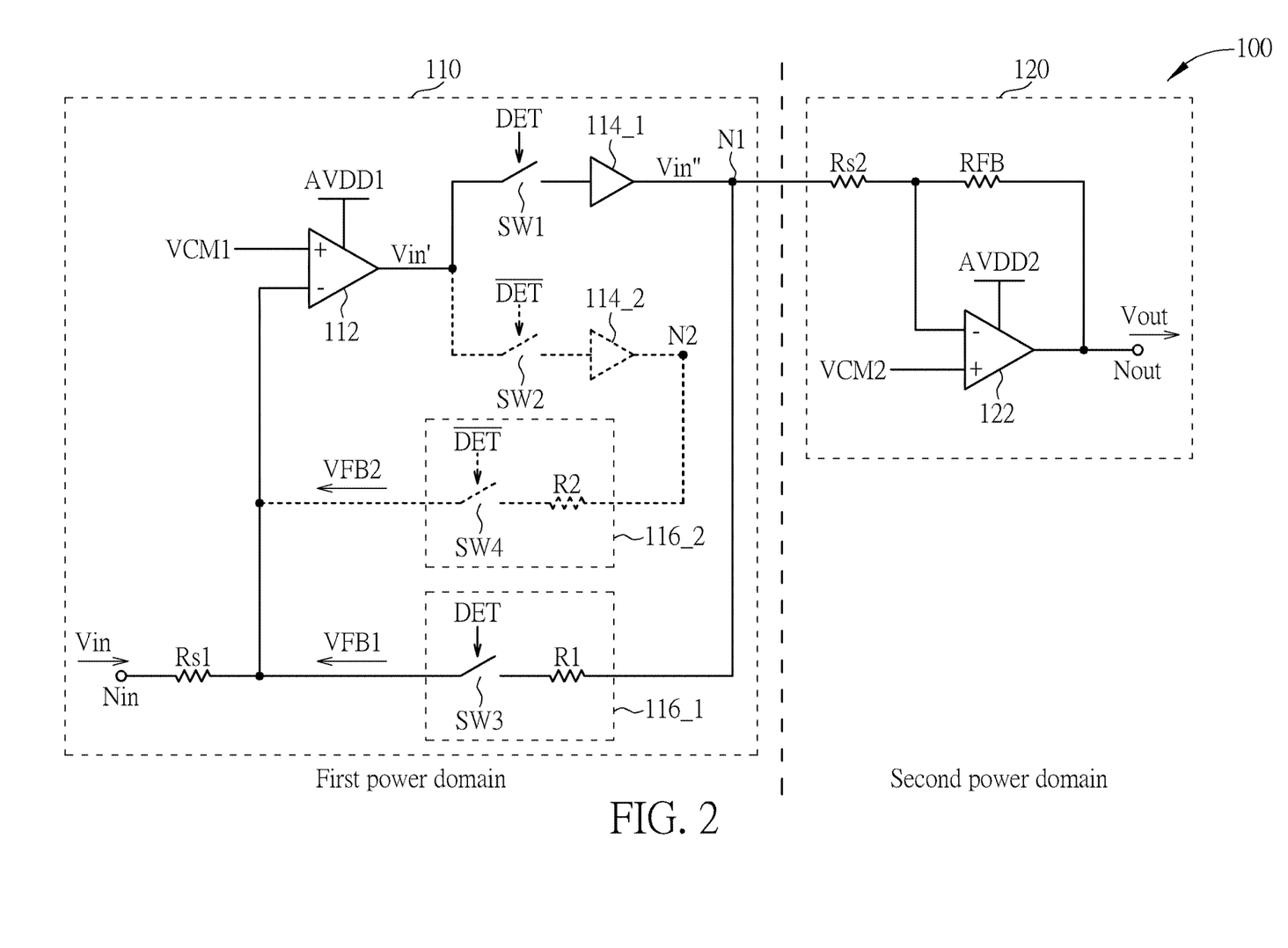
FIG. 2 illustrates the operation of the circuitry when both the first power domain and the second power domain are normally powered.

The circuitry 100 may operate in two modes. In a first mode, the first circuit block 110 and the second circuit block 120 are powered by the first supply voltage AVDD1 and the second supply voltage AVDD2, respectively, and the first amplifier 112 receives an input signal Vin from an input terminal Nin via the input resistor Rs1, and the first amplifier 112 also receives a reference signal VCM1 for generating a processed input signal Vin'. At this time, in the first mode where both the first power domain and the second power domain are normally powered, the first switch SW1 and the third switch SW3 are enabled to be in a conducting state, and the second switch SW2 and the fourth switch SW4 are disabled to be in a non-conducting state Therefore, the first buffer 114_1 can receive the processed input signal Vin' from the first switch SW1 to generate a buffered and processed input signal Vin" to the terminal N1, and the second amplifier 122 receives the buffered and processed input signal Vin" from the terminal N1 via the input resistor Rs2, and also receives a reference signal VCM2 for generating an output signal Vout at an output terminal Nout. Meanwhile, the first feedback circuit 116_1 receives the buffered and processed input signal Vin" from the terminal N1 to generate a first feedback signal VFB1 to the negative input terminal of the first amplifier 112. In addition, since the second switch SW2 and the fourth switch SW4 are in the non-conducting state, the second feedback circuit 116_2 does not generate any feedback signal. FIG. 2 illustrates the operation of the circuitry 100 when both the first power domain and the second power domain are normally powered (components that do not have substantial operations are represented by dashed lines).

Figure 3:
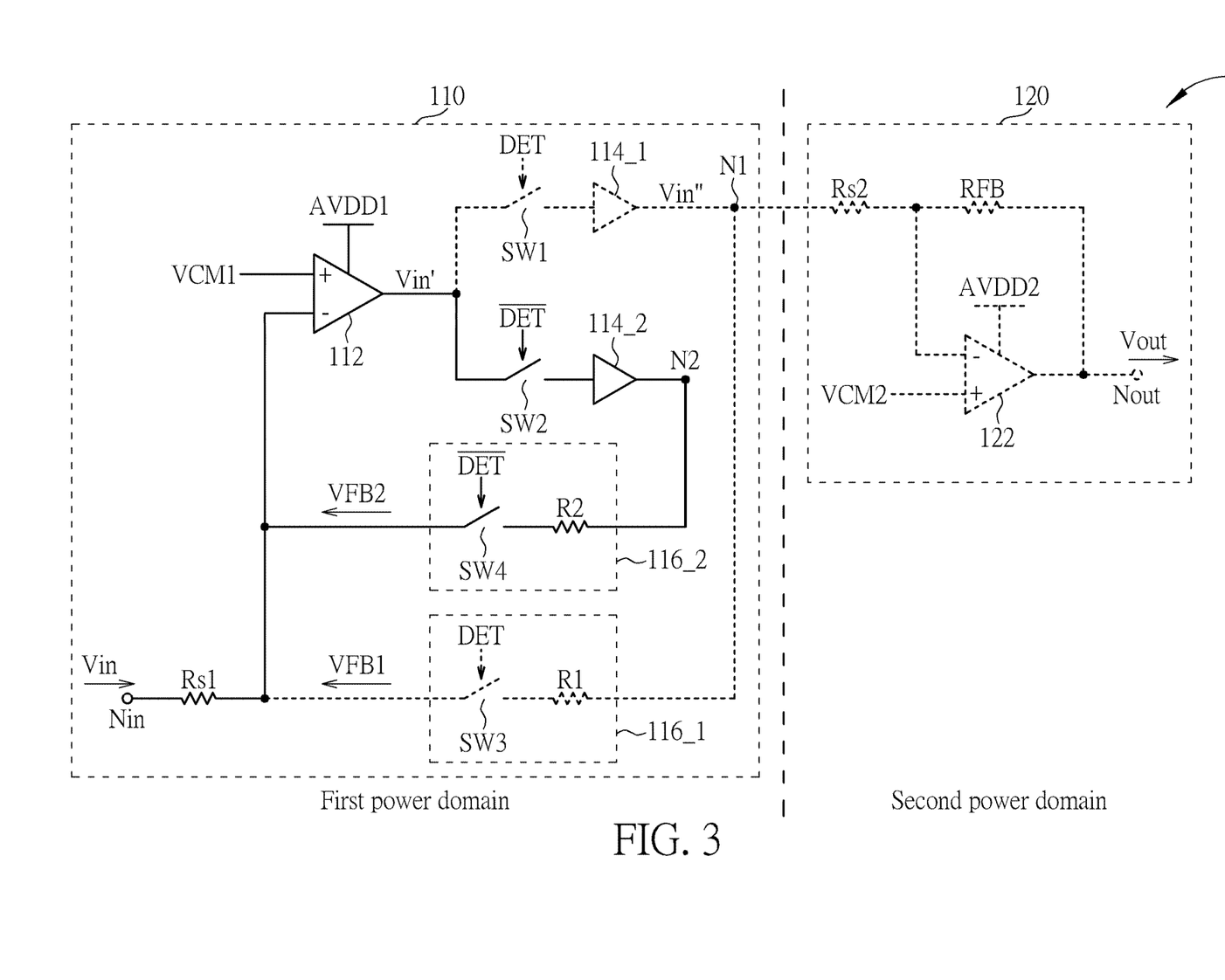
FIG. 3 illustrates the operation of the circuitry when the first power domain is normally powered, but the second power domain is not powered.

In a second mode, the first circuit block 110 is powered by the first supply voltage AVDD1 so that the input terminal Nin has a fixed DC voltage level, and the second circuit block 120 is not supplied by the second supply voltage AVDD2 (for example, the second circuit block 120 enters the sleep state), and the first amplifier 112 receives the input signal Vin from the input terminal Nin via the input resistor Rs1, and the first amplifier further receives the reference signal VCM1 for generating the processed input signal Vin'. At this time, when the first power domain is normally powered, but the second power domain is not powered, the first switch SW1 and the third switch SW3 are in the non-conductive state, and the second switch SW2 and the fourth switch SW4 are in the conductive state, therefore, the second buffer 114_2 can receive the signal Vin' to generate another buffered and processed input signal to a terminal N2, and the second feedback circuit 116_2 receives the buffered and processed input signal to generate a second feedback signal VFB2 to the negative input terminal of the first amplifier 112. In addition, since the first switch SW1 and the third switch SW3 are in the non-conducting state, the first switch SW1 and the third switch SW3 disconnect the path between the first amplifier 112 and the second circuit block 120, so that no leakage current in the first circuit block 110 flows into the second circuit block 120. In addition, the first feedback circuit 116_1 does not generate any feedback signal. FIG. 3 illustrates the operation of the circuitry 100 when the first power domain is normally powered, but the second power domain is not powered (the components that do not have substantial operations are represented by dashed lines).

It should be noted that the first amplifier 112 shown in FIG. 1 is an inverting type amplifier. However, this feature is not a limitation of the present invention. In other embodiments, the first amplifier 112 can be implemented by a non-inverting type amplifier or an amplifier having a unity gain buffer design.

Figure 4:
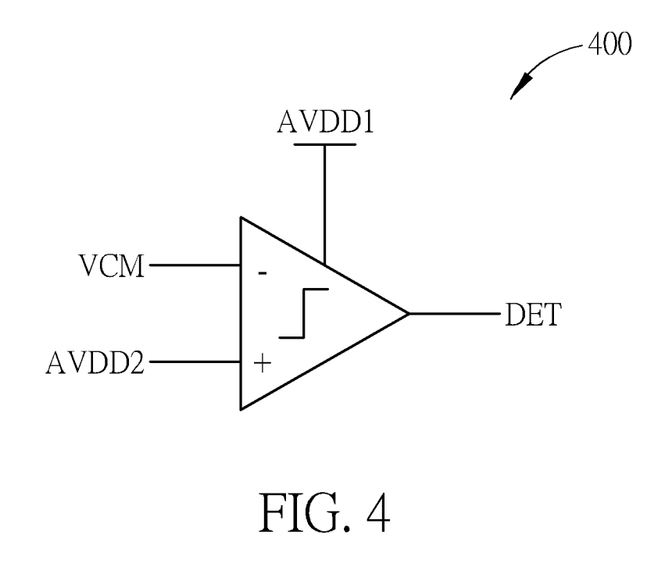
FIG. 4 shows a detection circuit according to one embodiment of the present invention.

In one embodiment, the first circuit block 110 may additionally include a detection circuit, and the detection circuit is used to detect whether the second supply voltage AVDD2 provided to the second amplifier 120 exists, to generate a detection result to control the conducting states or the non-conducting states of the first switch SW1, the second switch SW2, the third switch SW3 and the fourth switch SW4. Specifically, FIG. 4 is a diagram illustrating a detection circuit 400 according to an embodiment of the present invention. As shown in FIG. 4, the detection circuit 400 may be a comparator supplied by the first supply voltage AVDD1, and the detection circuit 400 is used to detect whether the second supply voltage AVDD2 is higher than a reference voltage VCM to generate the detection result DET. In this embodiment, when the detection result DET indicates that the second supply voltage AVDD2 exists, the detection result DET and its inverted signal $\overline{DET}$ control the first switch SW1 and the third switch SW3 in the conducting states, and control the second switch SW2 and the fourth switch SW4 in the non-conducting state, so that the second circuit block 120 can normally receive the buffered and processed input signal Vin" from the terminal N1. In addition, when the detection result DET indicates that the second supply voltage AVDD2 does not exist, the detection result DET and its inverted signal $\overline{DET}$ control the first switch SW1 and the third switch SW3 in the non-conductive state, and control the second switch SW2 and the fourth switch SW4 in the conductive state, to disconnect the path between the first amplifier 122 and the second circuit block 120, and the first circuit block 110 can operate normally.

In one embodiment, the circuitry 100 may be applied to an audio processing circuit in a desktop computer, a notebook computer or a mobile device, and the input signal Vin may be a sound signal from a microphone. In one embodiment, the input terminal Nin is also connected to a circuit node of the audio playback device. Therefore, in order to avoid a popping issue due the voltage variation at the input terminal Nin, the first amplifier 110 will continue to operate so that the input terminal Nin has a fixed DC voltage level, so as to prevent the second circuit block 120 of the second power domain from causing excessive changes in the voltage level of the input terminal Nin during the switching process between the sleep state and the normal state. The circuit structure proposed in the present invention can effectively solve the leakage current problem of the second circuit block 120.

Figure 5:
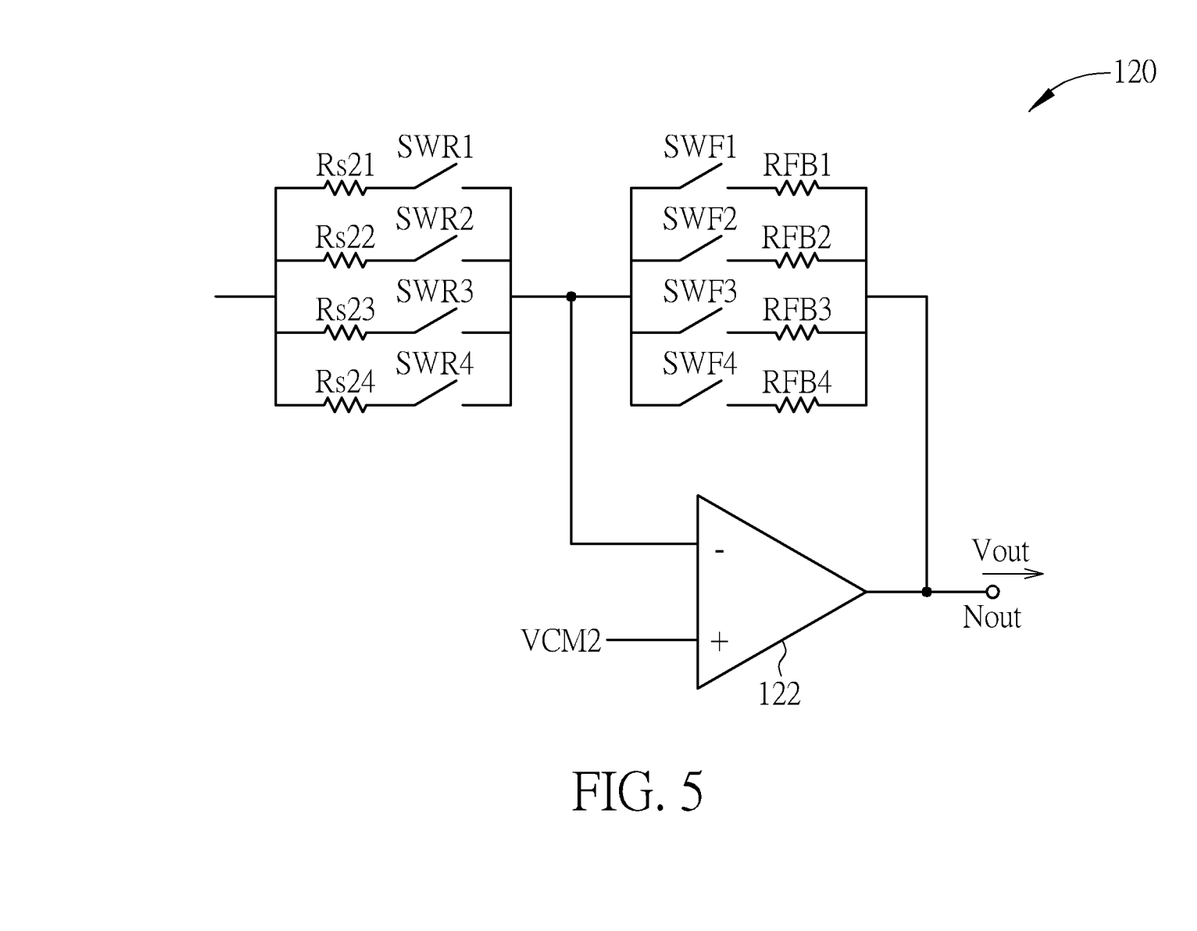
FIG. 5 shows that the circuitry is applied to a programmable gain amplifier according to one embodiment of the present invention.
Figure 6:
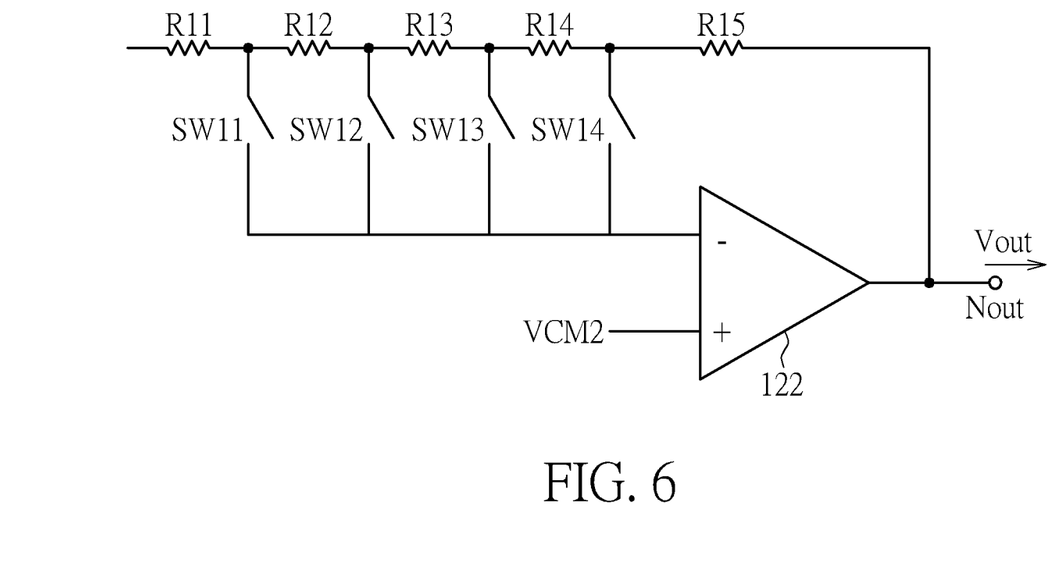
FIG. 6 shows that the circuitry is applied to a programmable gain amplifier according to another embodiment of the present invention.

In one embodiment, the circuitry 100 may be applied to a programmable gain amplifier with a variable resistance, and its main structure is to change the resistance of the input resistor Rs2 and the feedback resistor RFB in the second circuit block 120 to have different gains. The method of adjusting the resistance can refer to the embodiment shown in FIGS. 5 and 6. FIG. 5 uses multiple resistors Rs21-Rs24 and multiple switches SWR1-SWR4 to implement the input resistor Rs2, and the resistors RFB1-RFB4 and multiple switches SWF1-SWF4 are used to implement the feedback resistor RFB. In this embodiment, the resistance ratio can be determined by turning on/off the switches SWR1-SWR4 and SWF1-SWF4. In the embodiment shown in FIG. 5, although the switches SWR1-SWR4 and SWF1-SWF4 can also be used to avoid the leakage current generated under the aforementioned conditions, the signal path has the switches implemented by using the transistors, resulting in the increase of the total harmonic distortion (THD). Therefore, in consideration of the total harmonic distortion, it is recommended to avoid placing switches SWR1-SWR4 and SWF1-SWF4, but in this case, it is impossible to avoid leakage current by disabling the switches SWR1-SWR4 and SWF1-SWF4. The embodiment in FIG. 6 uses multiple resistors R111-R15 and multiple switches SW11-SW14 to implement the input resistor Rs2 and the feedback resistor RFB. In this embodiment, a summation of the resistance of the input resistance Rs2 and the feedback resistance RFB is a fixed value, and by selecting the switches to connect to the negative terminal of the amplifier 122, the resistance ratio can be adjusted. The embodiment of FIG. 6 can avoid the shortcoming of bad total harmonic distortion caused by series switches in the signal path of the embodiment of FIG. 5. Since the embodiment of FIG. 6 has no switch in the second circuit block 120 to disconnect the terminal N1 and the output terminal, the first circuit block 110 in the first power domain proposed by the present invention can effectively solve the leakage current problem of the programmable gain amplifier with variable resistance without reducing the total harmonic distortion performance.

Briefly summarized, in the circuitry applied to multiple power domains of the present invention, by detecting whether the second supply voltage disappears to determine whether to disconnect the path between the first circuit block and the second circuit block, the leakage current between different circuit blocks can be effectively avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuitry applied to multiple power domains, comprising:
   a first circuit block, wherein the first circuit block is powered by a first supply voltage of a first power domain;
   a second circuit block, wherein the second circuit block is powered by a second supply voltage of a second power domain;
   wherein the first circuit block comprises:
   a first amplifier, configured to receive an input signal to generate a processed input signal; and
   a switching circuit, wherein when the second circuit block is powered by the second supply voltage, the switching circuit is configured to forward the processed input signal to the second circuit block; and when the second circuit block is not powered by the second supply voltage, the switching circuit disconnects a path between the first amplifier and the second circuit block;
   wherein the first circuit block further comprises:
      a detection circuit, configured to determine if the second supply voltage supplied to the second circuit block exists to generate a detection result;
      wherein the switching circuit refers to the detection result to forward the processed input signal to the second circuit block or disconnect the path between the first amplifier and the second circuit block.

2. The circuitry of claim 1, wherein the second circuit block comprises a second amplifier, and the second amplifier is configured to receive the processed input signal to generate an output signal.

3. A circuitry applied to multiple power domains, comprising:
   a first circuit block, wherein the first circuit block is powered by a first supply voltage of a first power domain;
   a second circuit block, wherein the second circuit block is powered by a second supply voltage of a second power domain;
   wherein the first circuit block comprises:
   a first amplifier, configured to receive an input signal to generate a processed input signal; and
   a switching circuit, wherein when the second circuit block is powered by the second supply voltage, the switching circuit is configured to forward the processed input signal to the second circuit block; and when the second circuit block is not powered by the second supply voltage, the switching circuit disconnects a path between the first amplifier and the second circuit block;
   wherein the second circuit block receives the processed input signal via a terminal, and the circuitry further comprises:
      a first feedback circuit, coupled between the terminal and an input terminal of the first amplifier, wherein when the second circuit block is powered by the second supply voltage, the first feedback circuit generates a first feedback signal to the input terminal of the first amplifier by receiving the processed input signal from the terminal; and
      a second feedback circuit, wherein when the second circuit block is not powered by the second supply voltage, the second feedback circuit generates a second feedback signal to the input terminal of the first amplifier according to the processed input signal.

4. The circuitry of claim 3, wherein the switching circuit comprises:
   a first switch, configured to selectively connect an output terminal of the first amplifier to the second circuit block and the first feedback circuit; and
   a second switch, configured to selectively connect the output terminal of the first amplifier to the second feedback circuit.

5. The circuitry of claim 4, wherein when the second circuit block is powered by the second supply voltage, the first switch is enabled to make each of the second circuit block and the first feedback circuit receives the processed input signal, and the second switch is disabled so that the second feedback circuit does not receive the processed input signal; and when the second circuit block is not powered by the second supply voltage, the first switch is disabled so that the second circuit block and the first feedback circuit do not receive the processed input signal, and the second switch is enabled to make the second feedback circuit generate the processed input signal to generate the second feedback signal.

6. The circuitry of claim 4, wherein further comprising:
   a first buffer, coupled to the first switch, configured to receive the processed input signal from the first switch to generate a buffered and processed input signal to the second circuit block and the first feedback circuit; and
   a second buffer, coupled to the second switch, configured to receive the processed input signal from the second switch to generate another buffered and processed input signal to the second feedback circuit.

7. The circuitry of claim 3, wherein the first feedback circuit comprises a third switch, and the third switch is configured to selectively forward the first feedback signal to the input terminal of the first amplifier.

8. A circuitry, comprising:
   a first amplifier, configured to receive an input signal to generate a processed input signal;
   a first switch, configured to selectively connect an output terminal of the first amplifier to a first terminal;
   a second switch, configured to selectively connect the output terminal of the first amplifier to a second terminal;
   a first feedback circuit, coupled to the first terminal, configured to receive the processed input signal from the first switch to generate a first feedback signal to an input terminal of the first amplifier; and
   a second feedback circuit, coupled to the second terminal, configured to receive the processed input signal from the second switch to generate a second feedback signal to the input terminal of the first amplifier;
   wherein the first switch and the second switch are never in conductive states at the same time.

9. The circuitry of claim 8, further comprising:
a detection circuit, configured to determine whether a supply voltage of a circuit block connected to the first terminal exists to generate a detection result;
wherein when the detection result indicates that the supply voltage of the circuit block exists, the first switch is enabled to make the first feedback circuit receive the processed input signal from the first switch to generate the first feedback signal, and the second switch is disabled so that the second feedback circuit does not receive the processed input signal; and when the detection result indicates that the supply voltage does not exist, the first switch is disabled so that the first feedback circuit does not receive the processed input signal, and the second switch is enabled to make the second feedback circuit receive the processed input signal to generate the second feedback signal.

* * * * *